(12) United States Patent
Fujiwara et al.

(10) Patent No.: US 9,780,140 B2
(45) Date of Patent: Oct. 3, 2017

(54) X-RAY IMAGE SENSOR SUBSTRATE

(71) Applicant: Sharp Kabushiki Kaisha, Osaka-shi, Osaka (JP)

(72) Inventors: Masaki Fujiwara, Osaka (JP); Kohhei Tanaka, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 14/907,419

(22) PCT Filed: Aug. 5, 2014

(86) PCT No.: PCT/JP2014/004095
§ 371 (c)(1),
(2) Date: Jan. 25, 2016

(87) PCT Pub. No.: WO2015/019609
PCT Pub. Date: Feb. 12, 2015

(65) Prior Publication Data
US 2016/0190202 A1    Jun. 30, 2016

(30) Foreign Application Priority Data

Aug. 7, 2013    (JP) .................................. 2013-164343

(51) Int. Cl.
*H01L 27/146*    (2006.01)

(52) U.S. Cl.
CPC .. *H01L 27/14658* (2013.01); *H01L 27/14601* (2013.01); *H01L 27/14603* (2013.01); *H01L 27/14612* (2013.01); *H01L 27/14616* (2013.01); *H01L 27/14632* (2013.01); *H01L 27/14676* (2013.01)

(58) Field of Classification Search
CPC ......... H01L 27/14658; H01L 27/14676; H01L 27/14601
See application file for complete search history.

(56) References Cited

U.S. PATENT DOCUMENTS

| | | | |
|---|---|---|---|
| 6,570,161 B2 * | 5/2003 | You | H01L 27/14658 250/370.09 |
| 7,233,021 B2 * | 6/2007 | Izumi | G02F 1/1339 257/59 |
| 2003/0010922 A1 | 1/2003 | Yoon et al. | |
| 2011/0210355 A1 * | 9/2011 | Yamazaki | H01L 27/1225 257/98 |
| 2012/0153364 A1 * | 6/2012 | Yamazaki | H01L 29/7869 257/288 |

FOREIGN PATENT DOCUMENTS

JP    2004-087604 A    3/2004

* cited by examiner

*Primary Examiner* — Jamie C Niesz
(74) *Attorney, Agent, or Firm* — Keating & Bennett, LLP

(57) ABSTRACT

A thin film transistor substrate (2) includes: an auxiliary capacitor electrode (7); a gate insulating film (8) formed on an insulating substrate (4) to cover the auxiliary capacitor electrode (7); a drain electrode (11) formed on the gate insulating film (8) and an oxide semiconductor layer (9); a planarization film (13) formed on a passivation film (12); a capacitor electrode (14) formed on the planarization film (13); an interlayer insulating film (16) formed on the planarization film (13); and a pixel electrode (17) formed on the interlayer insulating film (16) and electrically connected to the drain electrode (11) via a contact hole (18).

4 Claims, 11 Drawing Sheets

X-RAY IMAGE SENSOR SUBSTRATE

TECHNICAL FIELD

The present invention relates to an X-ray image sensor substrate which displays an image of an object in accordance with a charge signal supplied from an X-ray conversion film which receives X-rays that have transmitted through the object.

BACKGROUND ART

In general, an X-ray imaging device includes an X-ray image sensor. An X-ray generator applies X-rays to an object such as a human body from multiple directions, and the X-ray image sensor measures an intensity distribution of the X-rays that transmitted through the object (that is, a projection of the object).

There has been disclosed an example of such an X-ray image sensor including, for example, a thin film transistor (hereinafter may be referred to as "TFT") formed on a transparent substrate, a first protective insulating film covering the TFT and other components together, a capacitor electrode formed on the first protective insulating film, at least a portion thereof shielding the TFT, a second protective insulating film formed on the first protective insulating film to cover the capacitor electrode, and a pixel electrode formed on the second protective insulating film to be connected to one of terminals of the TFT. This X-ray image sensor is configured such that a storage capacitor formed by the capacitor electrode, the second protective insulating film and the pixel electrode accumulates charges generated by applying X-rays to a conversion film (see, for example, Patent Document 1).

CITATION LIST

Patent Document

[Patent Document 1] Japanese Unexamined Patent Publication No. 2004-87604

SUMMARY OF THE INVENTION

Technical Problem

As the definition of the X-ray image sensor improves (i.e., as the pitch between pixels decreases), an area of electrodes forming the storage capacitor decreases, and thus the storage capacitor itself decreases.

Further, since a plurality of TFTs are connected to a data signal line (hereinafter referred to as a "source line"), leakage current from the plurality of TFTs generates noise.

Thus, if the storage capacitor decreases as described above, this storage capacitor is buried in noise caused by the leakage current of the TFTs. This makes it difficult to determine the difference in charge conversion derived from the difference in X-ray intensity.

In order to increase the storage capacitor, an area of electrodes forming the storage capacitor may be increased, or an insulating film may be thinned down to narrow a gap between the electrodes forming the storage capacitor. However, in a high-definition X-ray image sensor, the area of the electrodes cannot be increased easily. Further, the thinned insulating film affects the characteristics or yields (breakdown voltage) of the TFTs. Thus, the insulating film forming the storage capacitor cannot be thinned down easily.

In view of the foregoing, it is therefore an object of the present invention to provide an X-ray image sensor substrate which allows for increasing the storage capacitor by a simple configuration even if the definition is improved.

Solution to the Problem

To achieve the object described above, a first embodiment of an X-ray image sensor substrate of the present invention includes: an insulating substrate; a gate electrode and an auxiliary capacitor electrode formed on the insulating substrate; a gate insulating film formed on the insulating substrate to cover the gate electrode and the auxiliary capacitor electrode; a semiconductor layer formed on the gate insulating film to overlap with the gate electrode; a drain electrode formed on the gate insulating film and the semiconductor layer; a passivation film formed on the gate insulating film to cover the semiconductor layer and the drain electrode; a planarization film formed on the passivation film; a capacitor electrode formed on the planarization film; an interlayer insulating film formed on the planarization film to cover the capacitor electrode; and a pixel electrode formed on the interlayer insulating film and electrically connected to the drain electrode via a contact hole formed through the passivation film, the planarization film and the interlayer insulating film.

A second embodiment of the X-ray image sensor substrate of the present invention includes: an insulating substrate; a gate electrode and an auxiliary capacitor electrode formed on the insulating substrate; a gate insulating film formed on the insulating substrate to cover the gate electrode and the auxiliary capacitor electrode; a semiconductor layer formed on the gate insulating film to overlap with the gate electrode; a drain electrode formed on the gate insulating film and the semiconductor layer; a passivation film formed on the gate insulating film to cover the semiconductor layer and the drain electrode; and a capacitor electrode formed on the passivation film.

A third embodiment of the X-ray image sensor substrate of the present invention includes: an insulating substrate; a gate electrode and an auxiliary capacitor electrode formed on the insulating substrate; a gate insulating film formed on the insulating substrate to cover the gate electrode and the auxiliary capacitor electrode; a semiconductor layer formed on the gate insulating film to overlap with the gate electrode; a drain electrode formed on the gate insulating film and the semiconductor layer; a passivation film formed on the gate insulating film to cover the semiconductor layer and the drain electrode; a capacitor electrode formed on the passivation film; an interlayer insulating film formed on the passivation film to cover the capacitor electrode; and a pixel electrode formed on the interlayer insulating film and electrically connected to the drain electrode via a contact hole formed through the passivation film and the interlayer insulating film.

Advantages of the Invention

The present invention allows for ensuring a storage capacitor reliably, and thus the difference in charge conversion derived from the difference in X-ray intensity is determined with reliability. Therefore, a high-resolution image is obtainable by an X-ray image sensor improved in definition.

DESCRIPTION OF EMBODIMENTS

Embodiments of the present invention will be described in detail below with reference to the drawings. The present invention is not limited to the following embodiments.

First Embodiment

Figure 1:
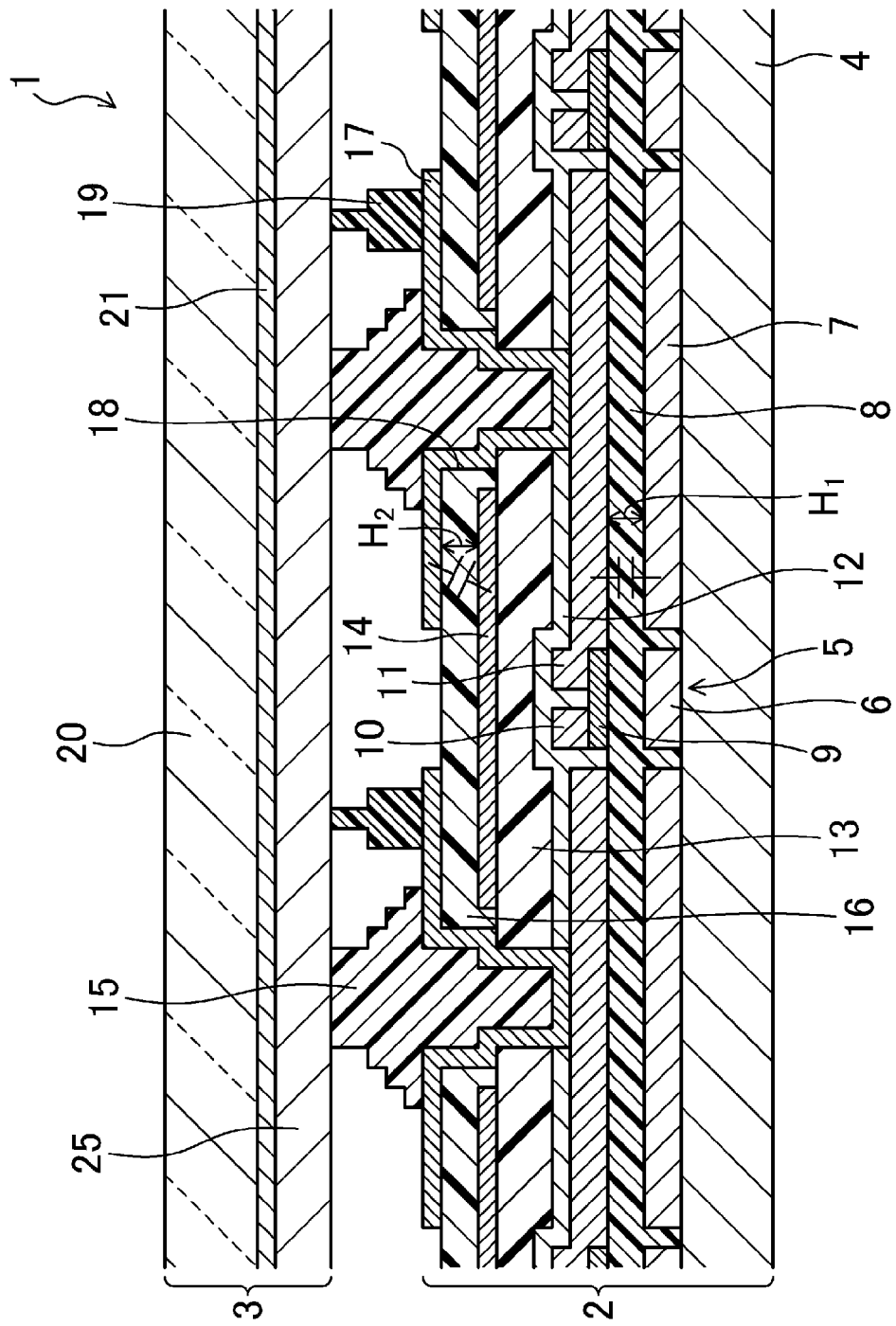
FIG. 1 is a cross-sectional view of an X-ray image sensor according to a first embodiment of the present invention.

FIG. 1 is a cross-sectional view of an X-ray image sensor according to a first embodiment of the present invention.

An X-ray image sensor 1 includes, as shown in FIG. 1, a thin film transistor substrate 2 provided with thin film transistors 5, a counter substrate 3 arranged to face the thin film transistor substrate 2 and provided with a conversion film 25, and a conductive resin member 15 provided between the thin film transistor substrate 2 and the counter substrate 3.

The thin film transistor 5 includes an insulating substrate 4 such as a glass substrate, a gate electrode 6 and an auxiliary capacitor electrode 7 formed on the insulating substrate 4, a gate insulating film 8 formed on the insulating substrate to cover the gate electrode 6 and the auxiliary capacitor electrode 7, an oxide semiconductor layer 9 having a channel region and being formed in an island pattern on the gate insulating film 8 to overlap with the gate electrode 6, and a source electrode 10 and a drain electrode 11 which are formed on the oxide semiconductor layer 9 to overlap with the gate electrode 6 and to face each other with the channel region interposed between the electrodes 10 and 11.

The thin film transistor substrate 2 is a substrate for the X-ray image sensor 1, and includes a passivation film 12 formed on the gate insulating film 8 to cover the thin film transistor 5 (i.e., the oxide semiconductor layer 9, the source electrode 10, and the drain electrode 11), a planarization film 13 formed on the passivation film 12, a capacitor electrode 14 formed on the planarization film 13, an interlayer insulating film 16 formed on the planarization film 13 to cover the capacitor electrode 14, and a pixel electrode 17 formed in a matrix pattern on the interlayer insulating film 16 and connected to the thin film transistor 5.

As shown in FIG. 1, a contact hole 18 is formed through the passivation film 12, the planarization film 13 and the interlayer insulating film 16, and the contact hole 18 is partially in contact with the drain electrode 11. In this contact hole 18, the pixel electrode 17 comes into contact with the drain electrode 11, and thus the pixel electrode 17 and the drain electrode 11 are electrically connected to each other.

That is to say, the drain electrode 11 is configured to be connected to the pixel electrode 17 via the contact hole 18 formed through the passivation film 12, the planarization film 13 and the interlayer insulating film 16.

Further, as shown in FIG. 1, the X-ray image sensor 1 includes a plurality of spacers 19 for keeping a cell gap uniform.

The spacers 19 are made of, for example, a photosensitive acrylic resin material, and are formed by photolithography.

Each of the gate electrode 6 and the auxiliary capacitor electrode 7 is constituted of, for example, a layered film including a first conductive film made of titanium or any other suitable material and formed on the insulating substrate 4, a second conductive film made of aluminum or any other suitable material and formed on the first conductive film, and a third conductive film made of titanium or any other suitable material and formed on the second conductive film. The source and drain electrodes 10 and 11 are also constituted of similar layered films.

The gate insulating film 8 and the passivation film 12 may be made of, for example, silicon oxide (SiO) or silicon nitride (SiN). Each of the gate insulating film 8 and the passivation film 12 may have a two-layered structure of a silicon oxide film and a silicon nitride film.

The planarization film 13 has the function of planarizing a film surface of the TFT 5. The planarization film 13 is made of an organic resin material such as an acrylic resin, or an inorganic material such as silicon oxide or silicon nitride described above. The planarization film 13 preferably has a thickness of 0.5 µm to 10 µm in view of flatness of the TFT 5 and reduction of a capacitor generated at intersections between gate bus lines and source bus lines.

The interlayer insulating film 16 may be made of, for example, silicon oxide (SiO) or silicon nitride (SiN). Just like the planarization film 13 described above, the interlayer insulating film 16 may also be made of an organic resin material such as an acrylic resin.

The oxide semiconductor layer 9 is constituted of an oxide semiconductor film made of an oxide semiconductor comprising indium, gallium and zinc, such as indium gallium zinc oxide (In—Ga—Zn—O).

The capacitor electrode 14 and the pixel electrode 17 may be made of, for example, indium tin oxide (ITO), indium zinc oxide (IZO), or indium tin oxide containing silicon oxide (ITSO). The capacitor electrode 14 and the pixel electrode 17 may also be made of metal such as aluminum, titanium, molybdenum, tungsten, tantalum, silver or copper, or a layered structure of these metals.

The counter substrate 3 includes, as shown in FIG. 1, an insulating substrate 20 such as a glass substrate, an electrode 21 formed on the insulating substrate 20 for applying a bias, and a conversion film 25 formed on the electrode 21.

The electrode 21 is made of, for example, metal such as aluminum, titanium, molybdenum, tungsten, tantalum, silver or copper, or a layered structure of these metals. A bias is applied to the conversion film 25 through the electrode 21. The electrode 21 may have a thickness of 0.5 µm to 30 µm, for example.

The conversion film 25 functions as a film which converts X-ray information into electric information, and may be made of, for example, CdTe, CdZnTe, InP, or a-Se. The conversion film 25 may have a thickness of 50 µm to 1000 µm, for example.

Examples of the counter substrate 3 of the present embodiment may include an insulating substrate 20 on which a conversion film 25 is formed by vapor deposition of CdTe or any other suitable material placed at a short distance from the substrate, or an insulating substrate 20 to which crystals of CdTe or any other suitable material carrying the electrode 21 directly deposited thereon are bonded to form a matrix array.

As shown in FIG. 1, a conductive resin member 15 is provided between the thin film transistor substrate 2 and the counter substrate 3. The conductive resin member 15 is in contact with the pixel electrode 17 formed on the thin film transistor substrate 2 and the conversion film 25 formed on the counter substrate 3. Thus, the conductive resin member 15 joins the thin film transistor substrate 2 to the counter substrate 3.

The conductive resin member 15 is made of, for example, a conductive resin material such as a resin material to which an excess amount of photosensitive carbon is added (e.g., a resin material for forming a light-shielding black matrix used in a liquid crystal display device), and is formed by photolithography. Alternatively, the conductive resin member 15 may be made of soldering metal. As shown in FIG. 1, the pixel electrode 17 and the conversion film 25 are electrically connected to each other through the conductive resin member 15.

In this X-ray image sensor 1, first, an X-ray generator emits and applies X-rays to an object such as a human body, and the X-rays that transmitted through the object enters the conversion film 25. Then, holes and electron pairs are generated in the conversion film 25. Then, if a bias is applied to the conversion film 25 through the electrode 21, charges of a polarity opposite to that of the applied bias which is either positive or negative (e.g., holes if a positive bias is applied) are accumulated in a storage capacitor of the thin film transistor substrate 2 through the conductive resin member 15. The accumulated charges are read as a current by the thin film transistor 5 of each pixel to convert the difference in intensity of X-ray transmission into amperage. Thus, an X-ray image recognizable as an image is obtained.

In that case, the X-ray image sensor 1 of the present embodiment includes, as shown in FIG. 1, a storage capacitor formed by the auxiliary capacitor electrode 7, the gate insulating film 8 and the drain electrode 11 in addition to the storage capacitor formed by the capacitor electrode 14, the interlayer insulating film 16 and the pixel electrode 17.

Thus, even if the area of the electrodes forming the storage capacitor is reduced due to improvement in definition of the X-ray image sensor 1 (i.e., improvement in resolution by reducing the pitch between pixels), the storage capacitor is ensured with reliability as compared with the conventional X-ray image sensor described above. This allows for preventing a disadvantage that the storage capacitor is buried in noise caused by the leakage current of the thin film transistor 5, and thus the difference in charge conversion derived from the difference in X-ray intensity is determined with reliability. As a result, a high-resolution image is obtainable by the X-ray image sensor 1 improved in definition.

In the present embodiment, for ensuring the magnitude of the storage capacitor without impairing the characteristics of the thin film transistor 5, the thickness $H_1$ of the gate insulating film 8 shown in FIG. 1 is set to be 5 to 1000 nm. For the same reason, the thickness $H_2$ of the interlayer insulating film 16 is set to be 50 to 1000 nm.

Figure 2:
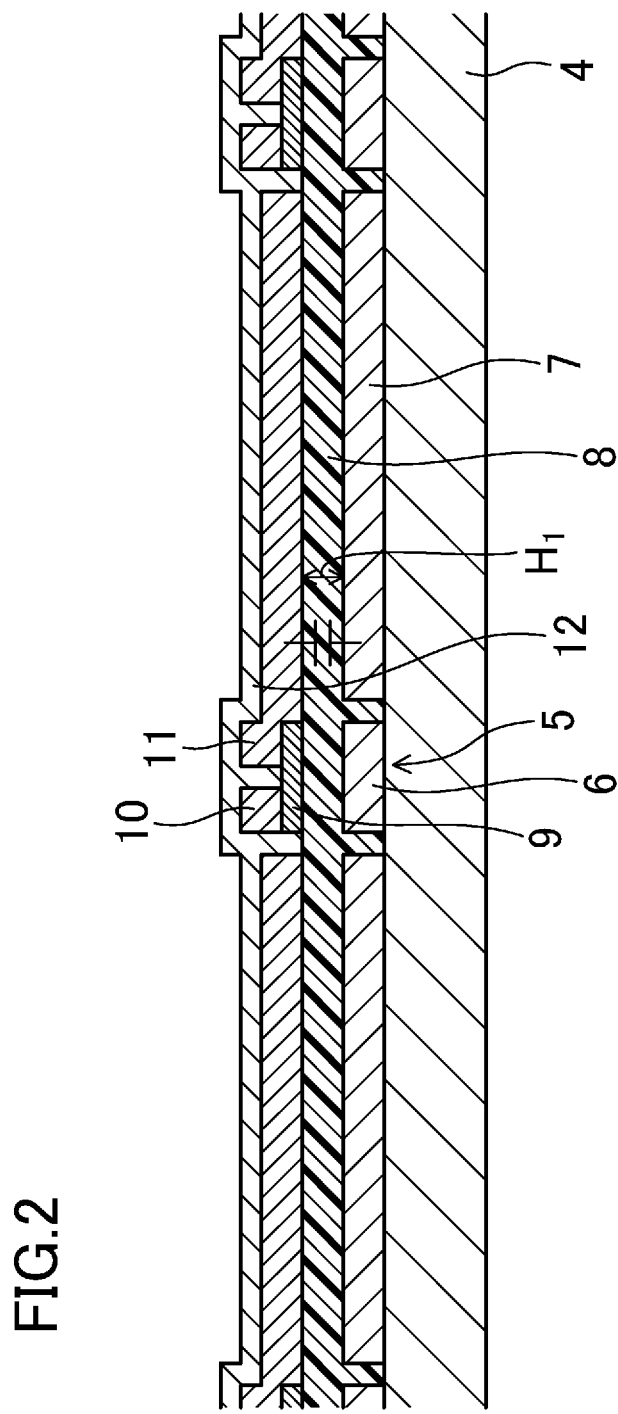
FIG. 2 is a cross-sectional view for illustrating processes of manufacturing the X-ray image sensor according to the first embodiment of the present invention.
Figure 3:
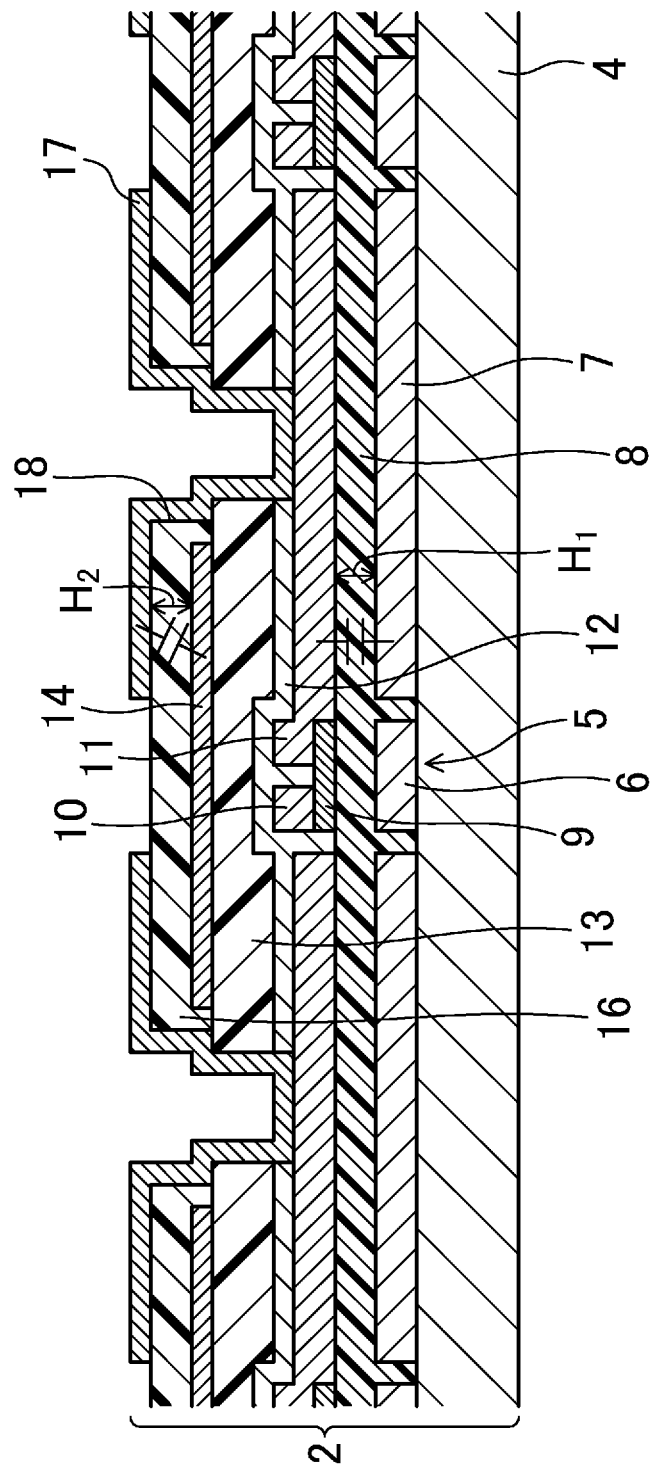
FIG. 3 is a cross-sectional view for illustrating processes of manufacturing the X-ray image sensor according to the first embodiment of the present invention.

An example of a method for manufacturing the X-ray image sensor of the present embodiment will be described below with reference to the drawings. FIGS. 2 and 3 are cross-sectional views for illustrating the processes of manufacturing the X-ray image sensor of the present embodiment.

<Process of Forming Gate Electrode>

On the entire surface of an insulating substrate 4 such as a glass substrate, a titanium film (10 nm to 200 nm in thickness), an aluminum film (about 100 nm to 800 nm in thickness), and another titanium film (50 to 500 nm in thickness) are deposited in this order by, for example, sputtering. Photolithography and etching are performed on these films, and a resist is peeled and washed away to form a gate electrode 6 and an auxiliary capacitor electrode 7 simultaneously on the insulating substrate 4 as shown in FIG. 2.

<Process of Forming Gate Insulating Film>

Then, on the entire surface of the substrate on which the gate electrode 6 and the auxiliary capacitor electrode 7 have been formed, a silicon oxide film, for example, is deposited by CVD to form a gate insulating film 8 (about 5 nm to 500 nm in thickness) to cover the gate electrode 6 and the auxiliary capacitor electrode 7 as shown in FIG. 2.

Photolithography and etching are performed on the gate insulating film 8, and a resist is peeled and washed away to form an opening for an external electrical input terminal in the gate insulating film 8.

Alternatively, the gate insulating film 8 may have a two-layered structure. In this case, for example, the gate insulating film 8 may have a two-layered structure of an oxide silicon film and a silicon nitride film described above.

In this case, the silicon nitride film may be formed as the lower gate insulating film using $SiH_4$ and $NH_3$ as a reaction gas, and the silicon oxide film may be formed as the upper gate insulating film using $N_2O$ and $SiH_4$ as a reaction gas.

<Process of Forming Oxide Semiconductor Layer>

Then, an In—Ga—Zn—O-based oxide semiconductor film (about 10 nm to 200 nm in thickness), for example, is deposited by sputtering. Then, photolithography and wet etching are performed on the oxide semiconductor film, and a resist is peeled and washed away to form an oxide semiconductor layer 9 on the gate insulating film 8 to overlap with the gate electrode 6 as shown in FIG. 3.

<Process of Forming Source and Drain Electrodes>

Then, on the entire surface of the substrate on which the oxide semiconductor layer 9 has been formed, a titanium film (10 nm to 200 nm in thickness), an aluminum film (about 100 nm to 800 nm in thickness), and another titanium film (50 to 500 nm in thickness), for example, are deposited in this order by, for example, sputtering. Then, photolithography and etching are performed on these films, and a resist is peeled and washed away to form a source electrode 10 and a drain electrode 11 simultaneously on the oxide semiconductor layer 9 and the gate insulating film 8 as shown in FIG. 2.

In this case, as shown in FIG. 2, a channel region of the oxide semiconductor layer 9 is exposed, and the source electrode 10 and the drain electrode 11 in the thin film transistor 5 are arranged to face each other with the channel region interposed between the electrodes 10 and 11.

Further, as shown in FIG. 2, the drain electrode 11 formed on the gate insulating film 8 is arranged to face the auxiliary capacitor electrode 7 with the gate insulating film 8 interposed between the electrodes 11 and 7. Thus, a storage capacitor is formed by the auxiliary capacitor electrode 7, the gate insulating film 8, and the drain electrode 11.

<Process of Forming Passivation Film>

Then, on the entire surface of the substrate on which the source electrode 10 and the drain electrode 11 have been formed, films such as a silicon nitride film and a silicon oxide film (about 5 nm to 500 nm in thickness) are deposited by plasma CVD. Photolithography and etching are then performed on these films, and a resist is peeled and washed away to form a passivation film 12 on the gate insulating film 8 to cover the thin film transistor 5 (to cover the oxide semiconductor layer 9, the source electrode 10, and the drain electrode 11) as shown in FIG. 2.

<Process of Forming Planarization Film>

Then, on the entire surface of the substrate on which the passivation film 12 has been formed, a photosensitive organic insulating film made of a photosensitive acrylic resin or any other suitable material is applied by spin coating or slit coating in a thickness of about 0.5 μm to 10 μm. Thus, a planarization film 13 is formed on the surface of the passivation film 12 as shown in FIG. 3.

<Process of Forming Capacitor Electrode>

Then, on the entire surface of the substrate on which the planarization film 13 has been formed, a transparent conductive film such as an IZO film made of indium zinc oxide (about 50 nm to 500 nm in thickness) is deposited by sputtering. Photolithography and wet etching are then performed on the transparent conductive film, and a resist is peeled and washed away to form a capacitor electrode 14 on the planarization film 13 as shown in FIG. 3.

<Process of Forming Interlayer Insulating Film>

Then, on the entire surface of the substrate on which the capacitor electrode 14 has been formed, a film such as a silicon oxide film or a silicon nitride film is deposited by plasma CVD to form an interlayer insulating film 16 (about 50 nm to 1000 nm in thickness) on the planarization film 13 to cover the capacitor electrode 14 as shown in FIG. 3.

<Process of Forming Contact Hole>

Then, photolithography is performed to form a pattern, expose the pattern to light, and develop the pattern, and then patterning is performed by etching to form a contact hole 18 through the passivation film 12, the planarization film 13 and the interlayer insulating film 16 as shown in FIG. 3.

<Process of Forming Pixel Electrode>

Then, on the entire surface of the substrate on which the interlayer insulating film 16 has been formed, a transparent conductive film such as an IZO film made of indium zinc oxide (about 50 nm to 500 nm in thickness) is deposited by sputtering. Then, photolithography and wet etching are performed on the transparent conductive film, and a resist is peeled and washed away to form a pixel electrode 17 on the contact hole 18 and the interlayer insulating film 16 as shown in FIG. 3.

In this process, as shown in FIG. 3, the pixel electrode 17 formed on the interlayer insulating film 16 is arranged to face the capacitor electrode 14 with the interlayer insulating film 16 interposed between the electrodes 17 and 14. Thus, a storage capacitor is formed by the capacitor electrode 14, the interlayer insulating film 16, and the pixel electrode 17.

<Process of Forming Spacers>

Then, spacers 19 are formed by photolithography. More specifically, a photosensitive acrylic resin is applied by spin coating onto the entire surface of the substrate on which the pixel electrode 17 has been formed. The photosensitive resin thus applied is exposed to light through a photomask and developed to form the spacers 19 each having a thickness of about 4 μm.

Through the above-described processes, a thin film transistor substrate 2 is manufactured.

<Process of Forming Conductive Resin Member>

Then, a conductive resin member 15 made of a conductive resin material such as a resin material to which an excess amount of photosensitive carbon is added is formed on the pixel electrode 17 formed on the contact hole 18 and the interlayer insulating film 16.

<Bonding Process>

Then, the counter substrate 3 including the insulating substrate 20 such as a glass substrate, the electrode 21 for bias application formed on the insulating substrate 20, and the conversion film 25 formed on the electrode 21 is prepared. The thin film transistor substrate 2 and the counter substrate 3 are bonded and joined together with the conductive resin member 15 interposed between the substrates 2 and 3.

In this process, the conductive resin member 15 provided between the thin film transistor substrate 2 and the counter substrate 3 comes into contact with the pixel electrode 17 formed on the thin film transistor substrate 2 and the conversion film 25 formed on the counter substrate 3. Thus, the pixel electrode 17 and the conversion film 25 are electrically connected to each other through the conductive resin member 15.

Through the above-described processes, the X-ray image sensor 1 of the present embodiment is manufactured.

The embodiment described above provides the following advantages.

(1) According to the present embodiment, the thin film transistor substrate 2 includes the storage capacitor formed by the capacitor electrode 14, the interlayer insulating film 16 and the pixel electrode 17 and the storage capacitor formed by the auxiliary capacitor electrode 7, the gate insulating film 8 and the drain electrode 11. Thus, even if the area of the electrodes forming the storage capacitor is reduced due to improvement in definition of the X-ray image sensor 1, the storage capacitor is ensured with reliability as compared with the conventional X-ray image sensor described above. As a result, the difference in charge conversion derived from the difference in X-ray intensity is determined with reliability, and thus a high-resolution image is obtainable by the X-ray image sensor 1 improved in definition.

(2) According to the present embodiment, the oxide semiconductor layer 9 is made of an oxide semiconductor constituted of indium, gallium and zinc. Thus, the thin film transistor 5 is provided with favorable characteristics such as high mobility and low off current.

Second Embodiment

Figure 4:
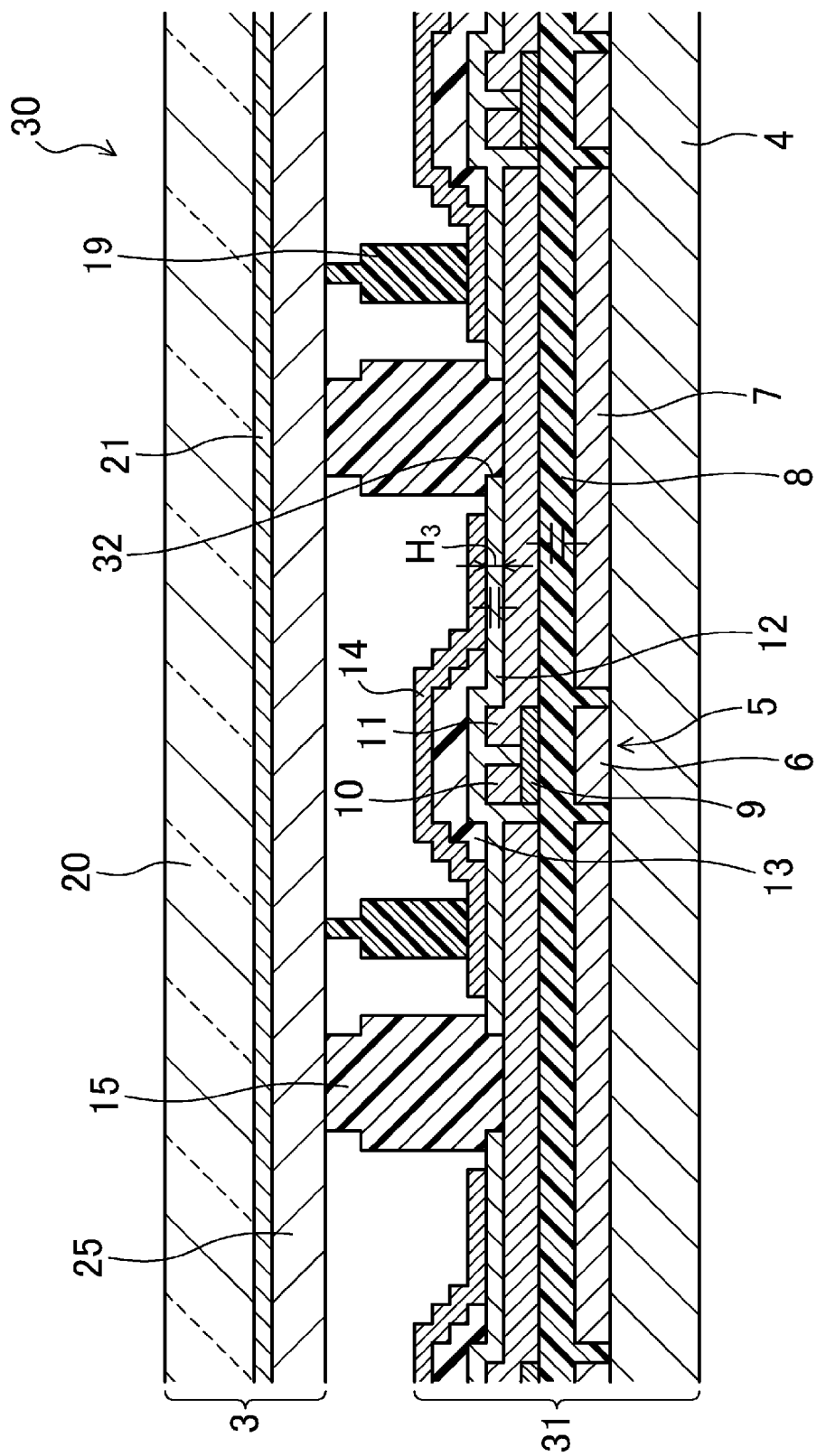
FIG. 4 is a cross-sectional view of an X-ray image sensor according to a second embodiment of the present invention.

A second embodiment of the present invention will be described below. FIG. 4 is a cross-sectional view of an X-ray image sensor according to the second embodiment of the present invention. The same reference characters designate components identical or corresponding to those described in the first embodiment, and description of such components may not be repeated.

An X-ray image sensor 30 of the present embodiment is characterized by including, in place of the storage capacitor formed by the capacitor electrode 14, the interlayer insulating film 16 and the pixel electrode 17 in the first embodiment, a storage capacitor formed by the drain electrode 11, the passivation film 12 and the capacitor electrode 14 as shown in FIG. 4.

With this configuration, just like the X-ray image sensor 1 of the first embodiment described above, the storage capacitor is ensured with reliability as compared with the conventional X-ray image sensor described above. This allows for preventing a disadvantage that the storage capacitor is buried in noise caused by the leakage current of the thin film transistor 5. As a result, the difference in charge conversion derived from the difference in X-ray intensity is determined with reliability, and thus a high-resolution image is obtainable by the X-ray image sensor 30 improved in definition.

Further, unlike the X-ray image sensor 1 of the first embodiment described above, the interlayer insulating film 16 and the pixel electrode 17 are no longer necessary. This simplifies the configuration of the X-ray image sensor 30, thereby allowing for ensuring the storage capacitor without increasing the number of manufacturing processes.

In a thin film transistor substrate 31 of the present embodiment, as shown in FIG. 4, the capacitor electrode 14 is formed on the planarization film 13 and the passivation film 12 to cover the planarization film 13, and thus the storage capacitor is formed by the drain electrode 11, the passivation film 12 and the capacitor electrode 14.

Further, a contact hole 32 is formed only through the passivation film 12, and this contact hole 32 is partially in contact with the drain electrode 11. The conductive resin member 15 is formed in the contact hole 32, and thus the conductive resin member 15 is in contact with the drain electrode 11 formed in the thin film transistor substrate 31 and the conversion film 25 formed on the counter substrate 3. Thus, as shown in FIG. 4, the drain electrode 11 and the conversion film 25 are electrically connected to each other through the conductive resin member 15.

Figure 5:
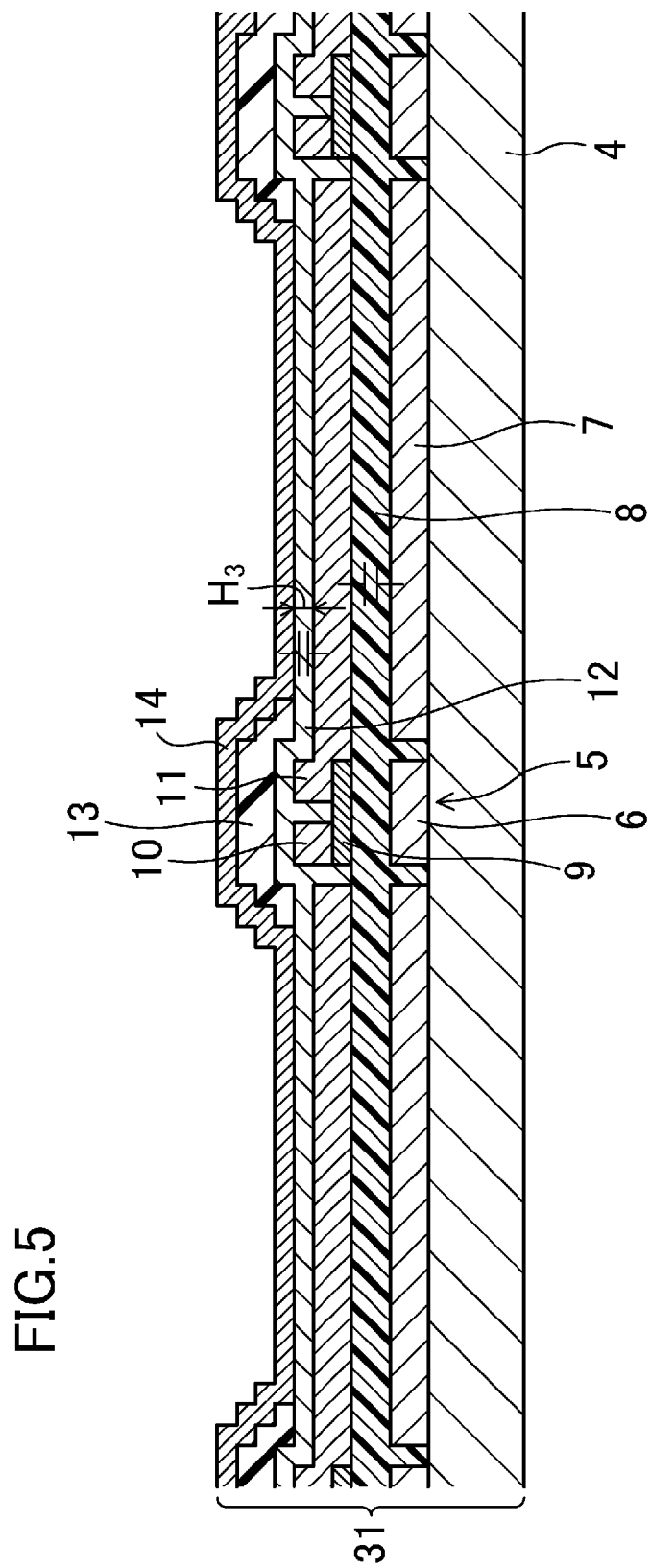
FIG. 5 is a cross-sectional view for illustrating processes of manufacturing the X-ray image sensor according to the second embodiment of the present invention.

An example of a method for manufacturing the X-ray image sensor of the present embodiment will be described below with reference to the drawings. FIG. 5 is a cross-sectional view for illustrating the processes of manufacturing the X-ray image sensor of the present embodiment.

First, in the same manner as the first embodiment described above (i.e., as shown in FIG. 2), the processes of forming the gate electrode, the gate insulating film, the oxide semiconductor layer, the source and drain electrodes, and the passivation film are performed.

In the present embodiment, the passivation film 12 shown in FIG. 4 is configured to have a thickness $H_3$ of 5 to 500 nm in view of ensuring the magnitude of the storage capacitor without impairing the characteristics of the thin film transistor 5.

<Process of Forming Planarization Film>

Then, on the entire surface of the substrate on which the passivation film 12 has been formed, a photosensitive organic insulating film made of a photosensitive acrylic resin or any other suitable material is applied by spin coating or slit coating in a thickness of about 0.5 μm to 10 μm. Thus, a planarization film 13 is formed on the passivation film 12 as shown in FIG. 5.

In the present embodiment, as shown in FIG. 5, the planarization film 13 is formed on a portion corresponding to the oxide semiconductor layer 9 of the thin film transistor 5 so as to cover the oxide semiconductor layer 9.

Further, the planarization film 13 formed to cover the gate bus lines allows for reducing a capacitor generated at the intersections between the gate bus lines and the source bus lines.

<Process of Forming Capacitor Electrode>

Then, on the entire surface of the substrate on which the planarization film 13 has been formed, a transparent conductive film such as an IZO film made of indium zinc oxide (about 50 nm to 500 nm in thickness) is deposited by sputtering. Photolithography and wet etching are performed on this transparent conductive film, and a resist is peeled and washed away to form a capacitor electrode 14 on the planarization film 13 and the passivation film 12 to cover the planarization film 13 as shown in FIG. 5. Thus, a storage capacitor is formed by the drain electrode 11, the passivation film 12 and the capacitor electrode 14.

<Process of Forming Contact Hole>

Then, photolithography is performed to form a pattern, expose the pattern to light, and develop the pattern, and then patterning is performed by etching to form a contact hole 32 through the passivation film 12 as shown in FIG. 4.

<Process of Forming Spacers>

Then, spacers 19 are formed by photolithography. More specifically, a photosensitive acrylic resin is applied by spin coating onto the entire surface of the substrate on which the capacitor electrode 14 has been formed. The photosensitive resin thus applied is exposed to light through a photomask and developed to form the spacers 19 each having a thickness of about 4 μm.

Through the above-described processes, a thin film transistor substrate 31 is manufactured.

Then, in the same manner as the first embodiment described above, the process of forming the conductive resin member and the bonding process are performed. Thus, the conductive resin member 15 provided between the thin film transistor substrate 31 and the counter substrate 3 comes into contact with the drain electrode 11 formed in the thin film transistor substrate 31 and the conversion film 25 formed on the counter substrate 3. As a result, the drain electrode 11 and the conversion film 25 are electrically connected to each other through the conductive resin member 15.

Through the above-described processes, the X-ray image sensor 30 of the present embodiment is manufactured.

The present embodiment described above provides the following advantages.

(3) According to the present embodiment, the thin film transistor substrate 31 includes the storage capacitor formed by the drain electrode 11, the passivation film 12 and the capacitor electrode 14, and the storage capacitor formed by the auxiliary capacitor electrode 7, the gate insulating film 8 and the drain electrode 11. Thus, even if the area of the electrodes forming the storage capacitor is reduced due to improvement in definition of the X-ray image sensor 30, the storage capacitor is ensured with reliability as compared with the conventional X-ray image sensor described above. As a result, the difference in charge conversion derived from the difference in X-ray intensity is determined with reliability, and thus a high-resolution image is obtainable by the X-ray image sensor 30 improved in definition.

(4) Unlike the X-ray image sensor 1 of the first embodiment, the interlayer insulating film 16 and the pixel electrode 17 are no longer necessary. This simplifies the configuration of the X-ray image sensor 30, and allows for ensuring the storage capacitor without increasing the number of manufacturing processes.

Third Embodiment

Figure 6:
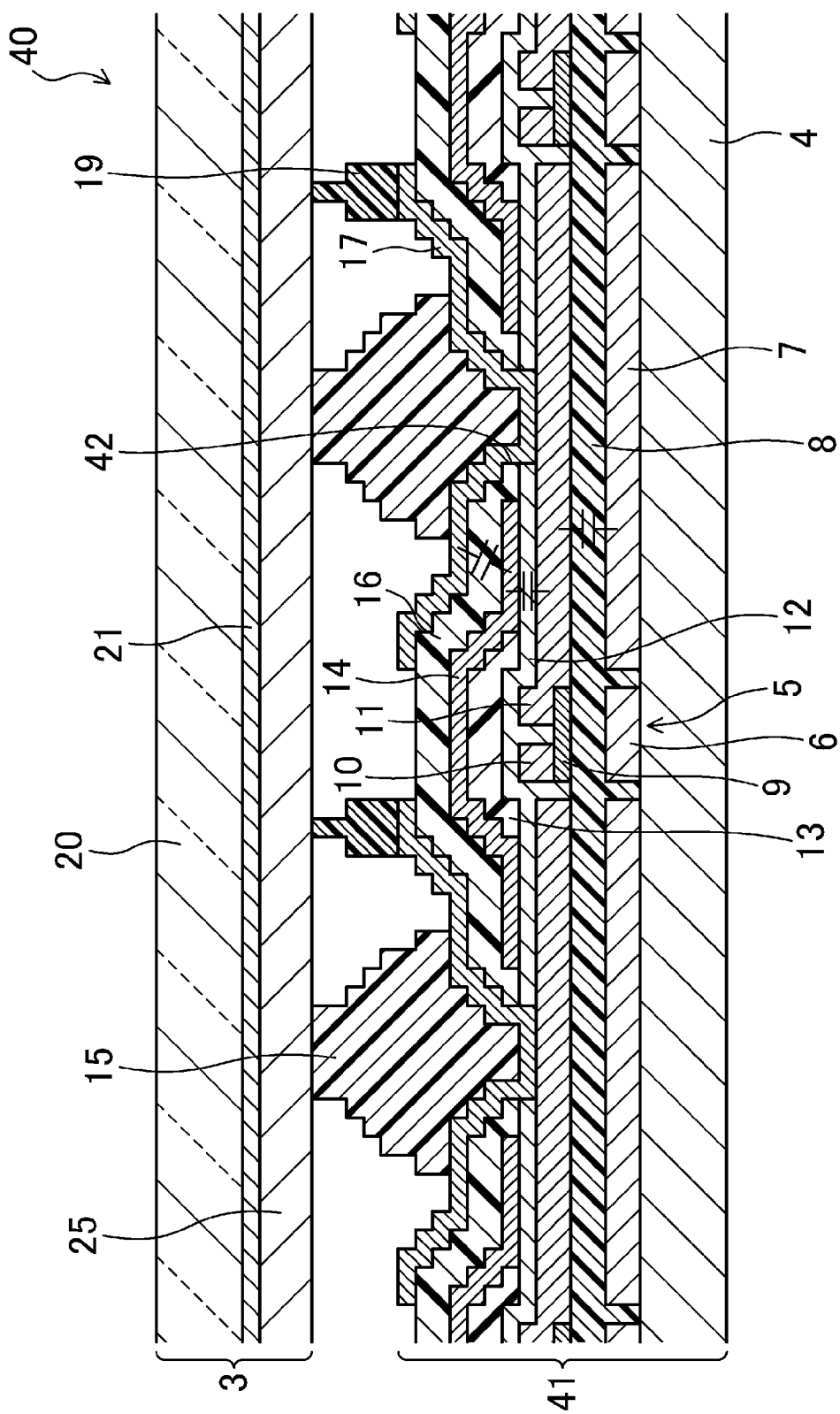
FIG. 6 is a cross-sectional view of an X-ray image sensor according to a third embodiment of the present invention.

A third embodiment of the present invention will be described below. FIG. 6 is a cross-sectional view of an X-ray image sensor according to the third embodiment of the present invention. The same reference characters designate components identical or corresponding to those described in the first and second embodiments, and description of such components may not be repeated.

As a feature of an X-ray image sensor 40 of the present embodiment, the X-ray image sensor 40 is formed by incorporating the interlayer insulating film 16 and the pixel electrode 17 described in the first embodiment into the X-ray image sensor 30 of the second embodiment, and includes additionally a storage capacitor formed by the capacitor electrode 14, the interlayer insulating film 16 and the pixel electrode 17.

In this configuration, the X-ray image sensor 40 of the present embodiment includes the storage capacitor formed by the auxiliary capacitor electrode 7, the gate insulating film 8 and the drain electrode 11, the storage capacitor formed by the drain electrode 11, the passivation film 12 and the capacitor electrode 14, and the storage capacitor formed by the capacitor electrode 14, the interlayer insulating film 16 and the pixel electrode 17. Thus, the storage capacitor is ensured with high reliability as compared with the conventional X-ray image sensor described above. This allows for preventing reliably a disadvantage that the storage capacitor is buried in noise caused by the leakage current of the thin film transistor 5, and thus the difference in charge conversion derived from the difference in X-ray intensity is determined with high reliability. As a result, a high-resolution image is obtainable with reliability by the X-ray image sensor 40 improved in definition.

As shown in FIG. 6, a thin film transistor substrate 41 of the present embodiment includes the interlayer insulating film 16 formed on the passivation film 12 to cover the capacitor electrode 14, and the pixel electrode 17 formed in a matrix pattern on the interlayer insulating film 16 and connected to the thin film transistor 5.

Further, as shown in FIG. 6, a contact hole 42 is formed through the passivation film 12 and the interlayer insulating film 16, and the contact hole 18 is partially in contact with the drain electrode 11. In this contact hole 18, the pixel electrode 17 comes into contact with the drain electrode 11, and thus the pixel electrode 17 and the drain electrode 11 are electrically connected to each other.

That is to say, the drain electrode 11 is configured to be connected to the pixel electrode 17 via the contact hole 42 formed through the passivation film 12 and the interlayer insulating film 16.

Further, a conductive resin member 15 is formed in the contact hole 42. This conductive resin member 15 is configured to be in contact with the drain electrode 11 formed in the thin film transistor substrate 41 and the conversion film 25 formed on the counter substrate 3. Thus, as shown in FIG. 6, the drain electrode 11 and the conversion film 25 are electrically connected to each other through the conductive resin member 15.

Figure 7:
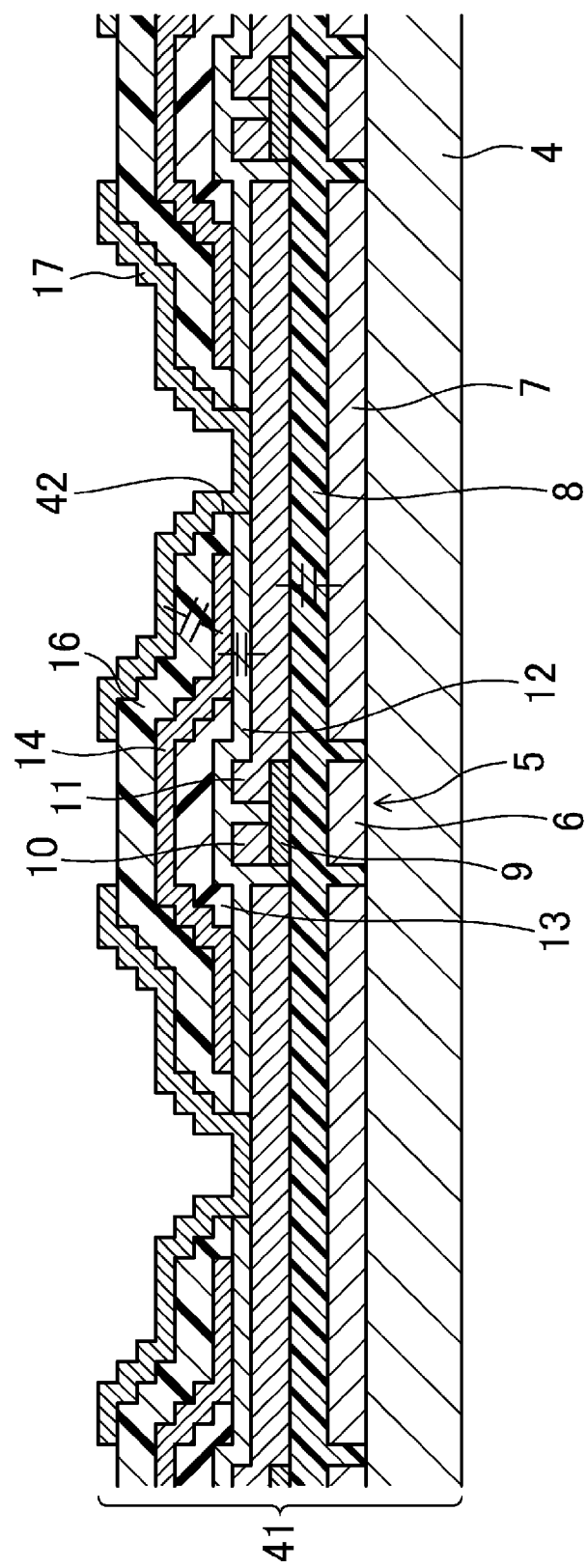
FIG. 7 is a cross-sectional view for illustrating processes of manufacturing the X-ray image sensor according to the third embodiment of the present invention.

An example of a method for manufacturing the X-ray image sensor of the present embodiment will be described below with reference to the drawings. FIG. 7 is a cross-sectional view for illustrating the processes of manufacturing the X-ray image sensor of the present embodiment.

First, in the same manner as the second embodiment described above, the processes of forming the gate electrode, the gate insulating film, the oxide semiconductor layer, the source and drain electrodes, the passivation film, the planarization film, and the capacitor electrode are performed.

<Process of Forming Interlayer Insulating Film>

Then, on the entire surface of the substrate on which the capacitor electrode 14 has been formed, a film such as a silicon oxide film or a silicon nitride film is deposited by plasma CVD to form an interlayer insulating film 16 (about 50 nm to 1000 nm in thickness) on the surface of the passivation film 12 to cover the capacitor electrode 14 and the planarization film 13 as shown in FIG. 7.

<Process of Forming Contact Hole>

Then, photolithography is performed to form a pattern, expose the pattern to light, and develop the pattern, and then patterning is performed by etching to form a contact hole 42 through the passivation film 12 and the interlayer insulating film 16 as shown in FIG. 7.

<Process of Forming Pixel Electrode>

Then, on the entire surface of the substrate on which the interlayer insulating film 16 has been formed, a transparent conductive film such as an IZO film made of indium zinc oxide (about 50 nm to 500 nm in thickness) is deposited by sputtering. Then, photolithography and wet etching are performed on the transparent conductive film, and a resist is peeled and washed away to form a pixel electrode 17 on the contact hole 42 and the interlayer insulating film 16 as shown in FIG. 7.

In this process, in the same manner as the first embodiment described above, the pixel electrode 17 formed on the interlayer insulating film 16 is arranged to face the capacitor electrode 14 with the interlayer insulating film 16 interposed between the electrodes 17 and 14 as shown in FIG. 7, and thus a storage capacitor is formed by the capacitor electrode 14, the interlayer insulating film 16 and the pixel electrode 17.

<Process of Forming Spacers>

Then, spacers 19 are formed by photolithography. More specifically, a photosensitive acrylic resin is applied by spin coating onto the entire surface of the substrate on which the pixel electrode 17 has been formed. The photosensitive resin thus applied is exposed to light through a photomask and developed to form the spacers 19 each having a thickness of about 4 μm.

Through the above-described processes, a thin film transistor substrate 41 is manufactured.

Then, in the same manner as the first embodiment described above, the process of forming the conductive resin member and the bonding process are performed. Thus, the conductive resin member 15 provided between the thin film transistor substrate 41 and the counter substrate 3 comes into contact with the pixel electrode 17 formed on the thin film transistor substrate 41 and the conversion film 25 formed on the counter substrate 3. As a result, the pixel electrode 17 and the conversion film 25 are electrically connected to each other through the conductive resin member 15.

Through the above-described processes, the X-ray image sensor 40 is manufactured.

The present embodiment described above provides the following advantages.

(5) According to the present embodiment, the thin film transistor substrate 41 includes the storage capacitor formed by the drain electrode 11, the passivation film 12 and the capacitor electrode 14, the storage capacitor formed by the auxiliary capacitor electrode 7, the gate insulating film 8 and the drain electrode 11, and the storage capacitor formed by the capacitor electrode 14, the interlayer insulating film 16 and the pixel electrode 17. Thus, even if the area of the electrodes forming the storage capacitor is reduced due to improvement in definition of the X-ray image sensor 40, the storage capacitor is ensured with reliability as compared with the conventional X-ray image sensor described above. As a result, the difference in charge conversion derived from the difference in the X-ray intensity is determined with reliability, and thus a high-resolution image is obtainable by the X-ray image sensor 40 improved in definition.

Fourth Embodiment

Figure 8:
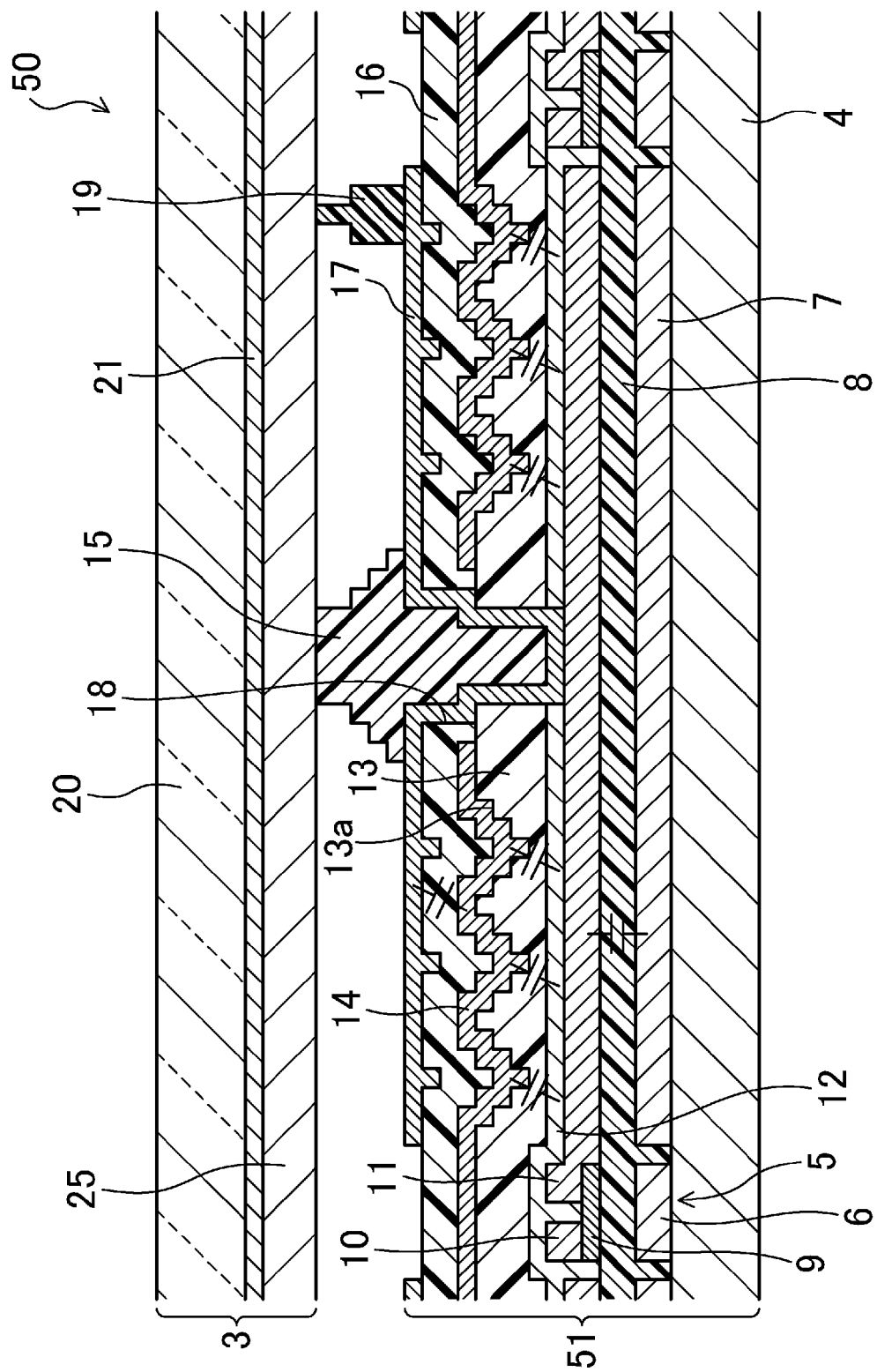
FIG. 8 is a cross-sectional view of an X-ray image sensor according to a fourth embodiment of the present invention.

A fourth embodiment of the present invention will be described below. FIG. 8 is a cross-sectional view of an X-ray image sensor according to the fourth embodiment of the present invention. The same reference characters designate components identical or corresponding to those described in the first, second and third embodiments, and description of such components may not be repeated.

As a feature of the X-ray image sensor 50 of the present embodiment, dimples 13a are formed in the planarization film 13 of the first embodiment, and a capacitor electrode 14 is formed on the dimples 13a.

This configuration allows for increasing the surface area of the capacitor electrode 14, and decreasing a distance between the drain electrode 11 and the capacitor electrode 14 at the dimples 13a.

In this configuration, the X-ray image sensor 50 of the present embodiment includes a storage capacitor formed by the auxiliary capacitor electrode 7, the gate insulating film 8 and the drain electrode 11, a storage capacitor formed by the drain electrode 11, the passivation film 12, the planarization film 13 and the capacitor electrode 14, and a storage capacitor formed by the capacitor electrode 14, the interlayer insulating film 16 and the pixel electrode 17. Thus, the storage capacitor is ensured with high reliability as compared with the conventional X-ray image sensor described above. This allows for preventing a disadvantage that the storage capacitor is buried in noise caused by the leakage current of the thin film transistor 5 with reliability, and thus the difference in charge conversion derived from the difference in X-ray intensity is determined with high reliability. As a result, a high-resolution image is obtainable with reliability by the X-ray image sensor 50 improved in definition.

Figure 9:
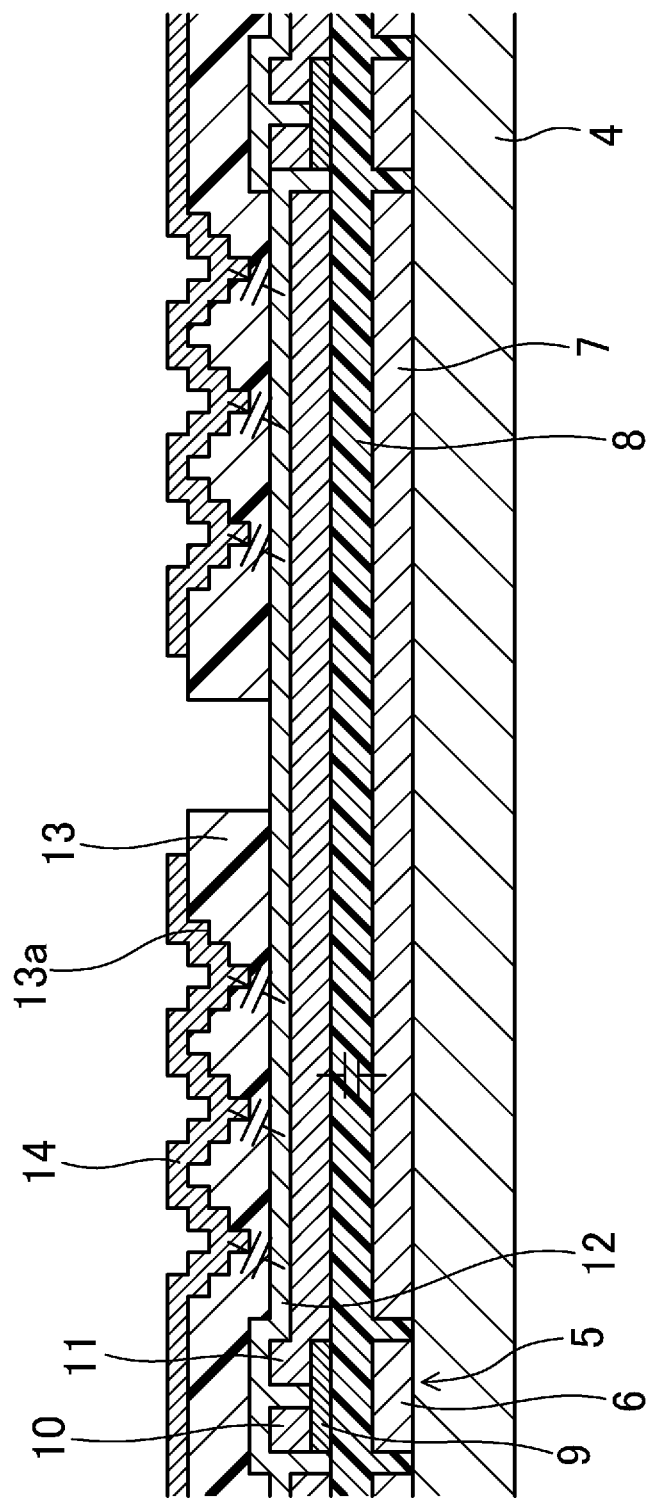
FIG. 9 is a cross-sectional view for illustrating processes of manufacturing the X-ray image sensor according to the fourth embodiment of the present invention.
Figure 10:
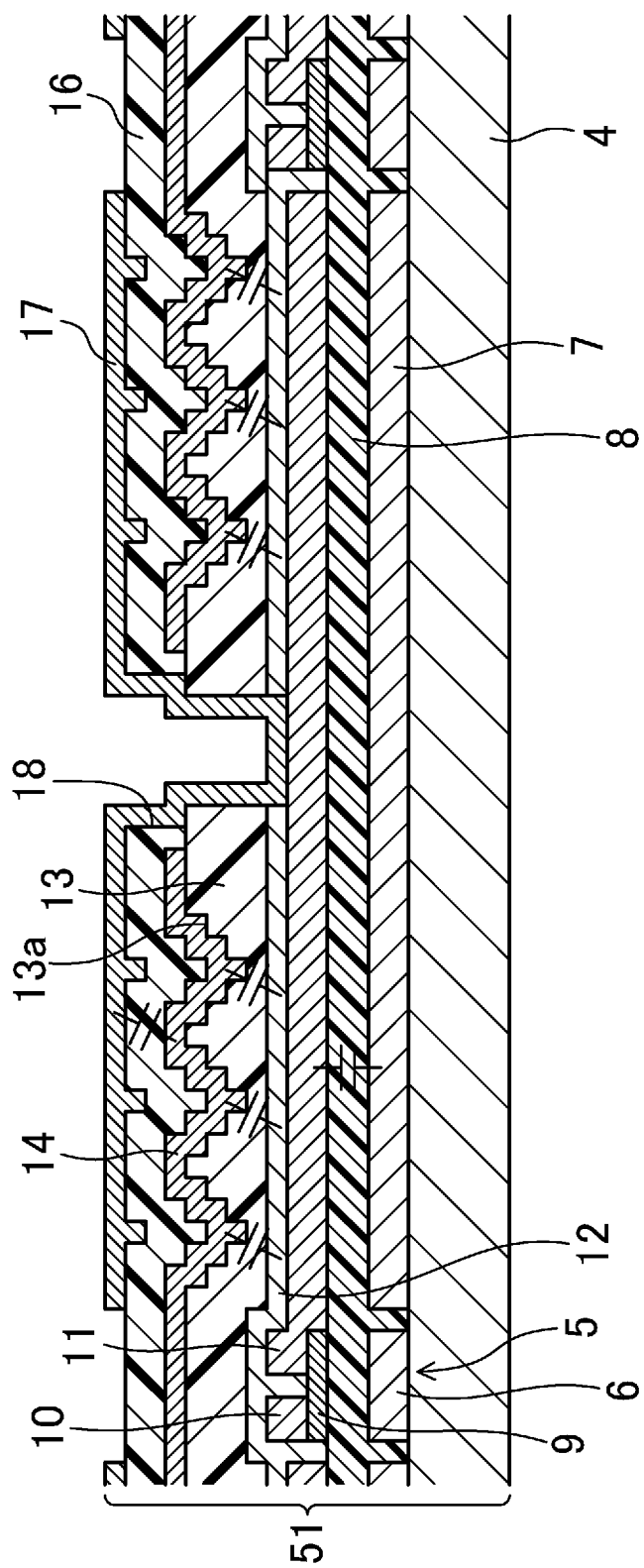
FIG. 10 is a cross-sectional view for illustrating processes of manufacturing the X-ray image sensor according to the fourth embodiment of the present invention.

An example of a method for manufacturing the X-ray image sensor of the present embodiment will be described below with reference to the drawings. FIGS. 9 and 10 are cross-sectional views for illustrating the processes of manufacturing the X-ray image sensor of the present embodiment.

First, in the same manner as the first embodiment described above (i.e., as shown in FIG. 2), the processes of forming the gate electrode, the gate insulating film, the oxide semiconductor layer, the source and drain electrodes, and the passivation film are performed.

<Process of Forming Planarization Film>

Then, on the entire surface of the substrate on which the passivation film 12 has been formed, a photosensitive organic insulating film made of a photosensitive acrylic resin or any other suitable material is applied by spin coating or slit coating in a thickness of about 0.5 µm to 10 µm. Thus, a planarization film 13 is formed on the passivation film 12 as shown in FIG. 9.

Then, using a mask having light-shielding portions and light-transmitting portions arranged in a checkers pattern, the planarization film 13 is exposed to light, developed and patterned to form dimples 13a in the planarization film 13 as shown in FIG. 9.

<Process of Forming Capacitor Electrode>

Then, on the entire surface of the substrate on which the planarization film 13 having the dimples 13a has been formed, a transparent conductive film such as an IZO film made of indium zinc oxide (about 50 nm to 500 nm in thickness) is deposited by sputtering. Photolithography and wet etching are then performed on this transparent conductive film, and a resist is peeled and washed away to form a capacitor electrode 14 on the planarization film 13 as shown in FIG. 9.

In this process, as shown in FIG. 9, the capacitor electrode 14 is formed on the dimples 13a of the planarization film 13, and thus a storage capacitor is formed by the drain electrode 11, the passivation film 12, the planarization film 13 and the capacitor electrode 14.

<Process of Forming Interlayer Insulating Film>

Then, on the entire surface of the substrate on which the capacitor electrode 14 has been formed, a film such as a silicon oxide film or a silicon nitride film is formed by plasma CVD to form an interlayer insulating film 16 (about 50 nm to 1000 nm in thickness) on the planarization film 13 to cover the capacitor electrode 14 as shown in FIG. 10.

<Process of Forming Contact Hole>

Then, photolithography is performed to form a pattern, expose the pattern to light, and develop the pattern, and then patterning is performed by etching to form a contact hole 18 through the passivation film 12, the planarization film 13 and the interlayer insulating film 16 as shown in FIG. 10.

<Process of Forming Pixel Electrode>

Then, on the entire surface of the substrate on which the interlayer insulating film 16 has been formed, a transparent conductive film such as an IZO film made of indium zinc oxide (about 50 nm to 500 nm in thickness) is deposited by sputtering. Photolithography and wet etching are then performed on this transparent conductive film, and a resist is peeled and washed away to form a pixel electrode 17 on the contact hole 18 and the interlayer insulating film 16 as shown in FIG. 10.

In this process, as shown in FIG. 10, the pixel electrode 17 formed on the interlayer insulating film 16 is arranged to face the capacitor electrode 14 with the interlayer insulating film 16 interposed between the electrodes 17 and 14, and thus a storage capacitor is formed by the capacitor electrode 14, the interlayer insulating film 16 and the pixel electrode 17.

<Process of Forming Spacers>

Then, spacers 19 are formed by photolithography. More specifically, on the entire surface of the substrate on which the pixel electrode 17 has been formed, a photosensitive acrylic resin is applied by spin coating, and the photosensitive resin thus applied is exposed to light through a photomask and developed to form spacers 19 each having a thickness of about 4 µm.

Through the above-described processes, a thin film transistor substrate 51 is manufactured.

Then, in the same manner as the first embodiment described above, the process of forming the conductive resin member and the bonding process are performed. Thus, the conductive resin member 15 provided between the thin film transistor substrate 51 and the counter substrate 3 comes into contact with the pixel electrode 17 formed on the thin film transistor substrate 51 and the conversion film 25 formed on the counter substrate 3. As a result, the pixel electrode 17 and the conversion film 25 are electrically connected to each other through the conductive resin member 15.

Through the above-described processes, the X-ray image sensor 50 of the present embodiment is manufactured.

The present embodiment described above provides the following advantages.

(6) According to the present embodiment, the thin film transistor substrate 51 includes a storage capacitor formed by the drain electrode 11, the passivation film 12 and the capacitor electrode 14, a storage capacitor formed by the auxiliary capacitor electrode 7, the gate insulating film 8 and the drain electrode 11, and a storage capacitor formed by the drain electrode 11, the passivation film 12, the planarization film 13 and the capacitor electrode 14. Thus, even if the area of the electrodes forming the storage capacitor is reduced due to improvement in definition of the X-ray image sensor 50, the storage capacitor is ensured with reliability as compared with the conventional X-ray image sensor described above. As a result, the difference in charge conversion derived from the difference in X-ray intensity is determined with reliability, and thus a high-resolution image is obtainable by the X-ray image sensor 50 improved in definition.

(7) Further, according to the present embodiment, the dimples 13a are formed in the planarization film 13, and the capacitor electrode 14 is formed on the dimples 13a. This configuration allows for increasing the surface area of the capacitor electrode 14, and decreasing a distance between the drain electrode 11 and the capacitor electrode 14 at the dimples 13a. As a result, an additional storage capacitor is formed by the drain electrode 11, the passivation film 12, the planarization film 13 and the capacitor electrode 14. Thus, the storage capacitor is ensured with high reliability as compared with the conventional X-ray image sensor described above.

The above-described embodiments may be modified in the following manner.

In the above-described embodiments, the oxide semiconductor layer 9 is used as the semiconductor layer. However, the semiconductor layer is not limited to the oxide semiconductor layer. In place of the oxide semiconductor, a silicon-based semiconductor layer made of amorphous silicon or polysilicon, for example, may be used as the semiconductor layer of the thin film transistor.

Further, in the above-described embodiments, the oxide semiconductor layer made of indium gallium zinc oxide (In—Ga—Zn—O) is used as the oxide semiconductor layer. However, the oxide semiconductor layer is not limited to this layer, and may be made of metal oxide containing at least one of indium (In), gallium (Ga), aluminum (Al), copper (Cu), zinc (Zn), magnesium (Mg), or cadmium (Cd).

The oxide semiconductor layer made of these materials shows high mobility even if it is amorphous, and thus allows for increasing ON resistance of a switching element. As a result, the difference in output voltage during data reading increases, thereby improving the S/N ratio.

For example, in place of the oxide semiconductor film made of IGZO (In—Ga—Zn—O), an oxide semiconductor film made of $InGaO_3(ZnO)_5$, $Mg_xZn_{1-x}O$, $Cd_xZn_{1-x}O$, or CdO may also be used.

In addition, ZnO which is added with at least one, or two or more of impurity elements of Group 1 element, Group 13 element, Group 14 element, Group 15 element or Group 17 element, and is in an amorphous state, a polycrystalline state, or a microcrystalline state in which amorphous ZnO and polycrystalline ZnO coexist may also be used. Alternatively, ZnO added with no such impurities may also be used.

The present invention may also be applied to other types of sensors such as a photosensor.

Figure 11:
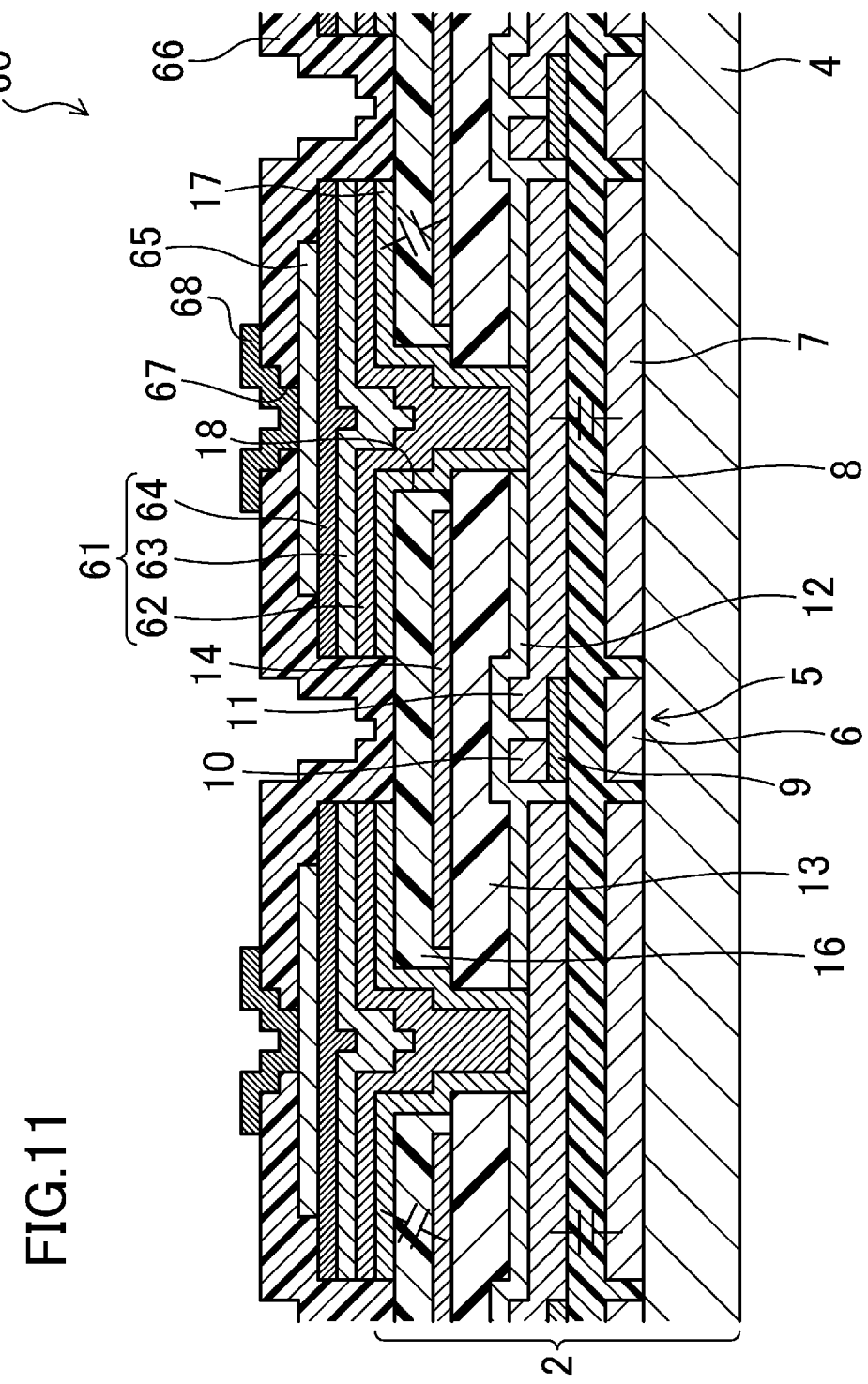
FIG. 11 is a cross-sectional view illustrating a photosensor according to an alternative example of the present invention.

More specifically, as shown in FIG. 11, the present invention may be applied to, for example, a photosensor 60 in which a photodiode 61 as a photoelectric conversion element is stacked on the pixel electrode 17.

The photodiode 61 is comprised of a layered film including an amorphous silicon film 62 doped with n-type impurities such as phosphorus (P), an undoped intrinsic amorphous silicon film 63, and an amorphous silicon film 64 doped with p-type impurities such as boron (B) which are stacked in this order from the bottom.

A transparent electrode 65 is formed on this photodiode 61. The transparent electrode 65 is connected, via a contact hole 67 formed through an interlayer insulating film 66 formed as a protective film covering the photodiode 61 and the transparent electrode 65, to a bias line 68 formed on the interlayer insulating film 66.

INDUSTRIAL APPLICABILITY

The present invention may be embodied as an X-ray image sensor substrate which displays an image of an object in accordance with a charge signal supplied from an X-ray conversion film which receives X-rays that have transmitted through the object.

DESCRIPTION OF REFERENCE CHARACTERS

1 X-ray Image Sensor
1 Thin Film Transistor Substrate (X-ray Image Sensor Substrate)
3 Counter Substrate
4 Insulating Substrate
5 Thin Film Transistor
6 Gate Electrode
7 Auxiliary Capacitor Electrode
8 Gate Insulating Film
9 Oxide Semiconductor Layer
10 Source Electrode
11 Drain Electrode
12 Passivation Film
13 Planarization Film
13a Dimple
14 Capacitor Electrode
15 Conductive Resin Member
16 Interlayer Insulating Film
17 Pixel Electrode
18 Contact Hole
19 Spacer
20 Insulating Substrate
21 Electrode
25 Conversion Film
30 X-ray Image Sensor
31 Thin Film Transistor Substrate (X-ray Image Sensor Substrate)
32 Contact Hole
40 X-ray Image Sensor
41 Thin Film Transistor Substrate (X-ray Image Sensor Substrate)
42 Contact Hole
50 X-ray Image Sensor
51 Thin Film Transistor Substrate (X-ray Image Sensor Substrate)

The invention claimed is:
1. An X-ray image sensor substrate comprising:
an insulating substrate;
a gate electrode and an auxiliary capacitor electrode on the insulating substrate;
a gate insulating film on the insulating substrate to cover the gate electrode and the auxiliary capacitor electrode;
a semiconductor layer on the gate insulating film to overlap with the gate electrode;
a drain electrode on the gate insulating film and the semiconductor layer, and facing the auxiliary capacitor electrode with the gate insulating film between the drain electrode and the auxiliary capacitor electrode to define a first storage capacitor;

a passivation film on the gate insulating film to cover the semiconductor layer and the drain electrode;

a planarization film on the passivation film;

a capacitor electrode on the planarization film;

an interlayer insulating film on the planarization film to cover the capacitor electrode; and a pixel electrode on the interlayer insulating film and electrically connected to the drain electrode via a contact hole formed through the passivation film, the planarization film, and the interlayer insulating film, the pixel electrode facing the capacitor electrode with the interlayer insulating film between the pixel electrode and the capacitor electrode to define a second storage capacitor.

2. The X-ray image sensor substrate of claim 1, wherein a dimple is in the planarization film, and the capacitor electrode is on the dimple.

3. An X-ray image sensor substrate comprising:

an insulating substrate;

a gate electrode and an auxiliary capacitor electrode on the insulating substrate;

a gate insulating film on the insulating substrate to cover the gate electrode and the auxiliary capacitor electrode;

a semiconductor layer on the gate insulating film to overlap with the gate electrode;

a drain electrode on the gate insulating film and the semiconductor layer, and facing the auxiliary capacitor electrode with the gate insulating film between the drain electrode and the auxiliary capacitor electrode to define a first storage capacitor;

a passivation film on the gate insulating film to cover the semiconductor layer and the drain electrode;

a capacitor electrode on the passivation film and facing the drain electrode with the passivation film between the capacitor electrode and the drain electrode, to define a second storage capacitor;

an interlayer insulating film on the passivation film to cover the capacitor electrode; and a pixel electrode on the interlayer insulating film and electrically connected to the drain electrode via a contact hole formed through the passivation film and the interlayer insulating film, the pixel electrode facing the capacitor electrode with the interlayer insulating film between the pixel electrode and the capacitor electrode to define a third storage capacitor.

4. The X-ray image sensor substrate of claim 1, wherein the semiconductor layer is an oxide semiconductor layer.

* * * * *